(12) United States Patent
Cheng et al.

(10) Patent No.: US 12,324,258 B2
(45) Date of Patent: Jun. 3, 2025

(54) IMAGE SENSOR WITH IMPROVED QUANTUM EFFICIENCY SURFACE STRUCTURE

(71) Applicant: Taiwan Semiconductor Manufacturing Co., Ltd., Hsinchu (TW)

(72) Inventors: Yun-Wei Cheng, Taipei (TW); Chun-Hao Chou, Tainan (TW); Kuo-Cheng Lee, Tainan (TW); Hsun-Ying Huang, Tainan (TW); Shih-Hsun Hsu, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 17/717,489

(22) Filed: Apr. 11, 2022

(65) Prior Publication Data
US 2022/0231075 A1    Jul. 21, 2022

Related U.S. Application Data

(60) Division of application No. 16/869,305, filed on May 7, 2020, now Pat. No. 11,302,738, which is a
(Continued)

(51) Int. Cl.
*H01L 27/146*    (2006.01)
*H10F 39/00*    (2025.01)
(Continued)

(52) U.S. Cl.
CPC ....... *H10F 39/1892* (2025.01); *H10F 39/024* (2025.01); *H10F 39/026* (2025.01);
(Continued)

(58) Field of Classification Search
CPC ..... H01L 25/167; H01L 27/14643–156; H01L 27/3227; H01L 31/02024; H01L 31/0203;
(Continued)

(56) References Cited

U.S. PATENT DOCUMENTS 7,759,755 B2    7/2010    Adkisson et al.
9,818,779 B2    11/2017    Tu et al.
(Continued)

FOREIGN PATENT DOCUMENTS

CN    104952892 A    9/2015
JP    2011044489 A    3/2011
(Continued)

*Primary Examiner* — Cuong B Nguyen
(74) *Attorney, Agent, or Firm* — Sterne, Kessler, Goldstein & Fox P.L.L.C.

(57) ABSTRACT

The present disclosure relates to a semiconductor image sensor with improved quantum efficiency. The semiconductor image sensor can include a semiconductor layer having a first surface and a second surface opposite of the first surface. An interconnect structure is disposed on the first surface of the semiconductor layer, and radiation-sensing regions are formed in the semiconductor layer. The radiation-sensing regions are configured to sense radiation that enters the semiconductor layer from the second surface and groove structures are formed on the second surface of the semiconductor layer.

20 Claims, 9 Drawing Sheets

Related U.S. Application Data continuation of application No. 16/866,215, filed on May 4, 2020, now Pat. No. 11,189,657, which is a division of application No. 15/882,382, filed on Jan. 29, 2018, now Pat. No. 10,644,060.

(60) Provisional application No. 62/564,830, filed on Sep. 28, 2017.

(51) Int. Cl.
*H10F 39/12* (2025.01)
*H10F 39/18* (2025.01)

(52) U.S. Cl.
CPC ........... *H10F 39/18* (2025.01); *H10F 39/199* (2025.01); *H10F 39/8023* (2025.01); *H10F 39/8067* (2025.01); *H10F 39/807* (2025.01); *H10F 39/811* (2025.01)

(58) Field of Classification Search
CPC ............... H01L 31/1032; H01L 31/107; H01L 27/14659; H01L 27/14605; H01L 27/14629; H01L 27/1463; H01L 27/14632; H01L 27/14636; H01L 27/1464; H01L 27/14685; H01L 27/14687; H01L 27/146; H01L 27/14603; H01L 27/14683; H10F 39/1892; H10F 39/024; H10F 39/026; H10F 39/18; H10F 39/199; H10F 39/8023; H10F 39/8067; H10F 39/807; H10F 39/811; H10D 84/80; H10D 62/117; H10D 30/611; H10H 20/816
See application file for complete search history.

(56) References Cited

U.S. PATENT DOCUMENTS

| | | | |
|---|---|---|---|
| 9,991,285 | B2 | 6/2018 | Chang et al. |
| 11,302,738 | B2 | 4/2022 | Cheng et al. |
| 2005/0040440 | A1 | 2/2005 | Murakami |
| 2005/0184353 | A1 | 8/2005 | Mouli |
| 2006/0049476 | A1* | 3/2006 | Koizumi ........... H01L 27/14621 257/432 |
| 2007/0249138 | A1* | 10/2007 | Li ..................... H01L 27/14689 438/424 |
| 2011/0042552 | A1 | 2/2011 | Furuya et al. |
| 2013/0069190 | A1 | 3/2013 | Kao et al. |
| 2014/0217538 | A1* | 8/2014 | Shimotsusa ....... H01L 27/14627 257/432 |
| 2015/0287761 | A1 | 10/2015 | Huang et al. |
| 2016/0112614 | A1* | 4/2016 | Masuda ................. H04N 25/70 348/374 |
| 2016/0197223 | A1 | 7/2016 | Pagani |
| 2016/0211288 | A1 | 7/2016 | Yanagita et al. |
| 2016/0363673 | A1 | 12/2016 | Ahn |
| 2017/0110493 | A1 | 4/2017 | Yokogawa |
| 2017/0278881 | A1 | 9/2017 | Hsu et al. |
| 2017/0278893 | A1 | 9/2017 | Cheng et al. |
| 2018/0175091 | A1* | 6/2018 | Jeon ................. H01L 27/14636 |
| 2018/0301490 | A1 | 10/2018 | Dofuku |
| 2019/0027518 | A1* | 1/2019 | Miyata ............. H01L 27/14621 |

FOREIGN PATENT DOCUMENTS

| | | |
|---|---|---|
| KR | 20160144667 A | 12/2016 |
| TW | 201517272 A | 5/2015 |
| TW | 201537739 A | 10/2015 |
| WO | WO 2017/126329 A1 | 7/2017 |

* cited by examiner

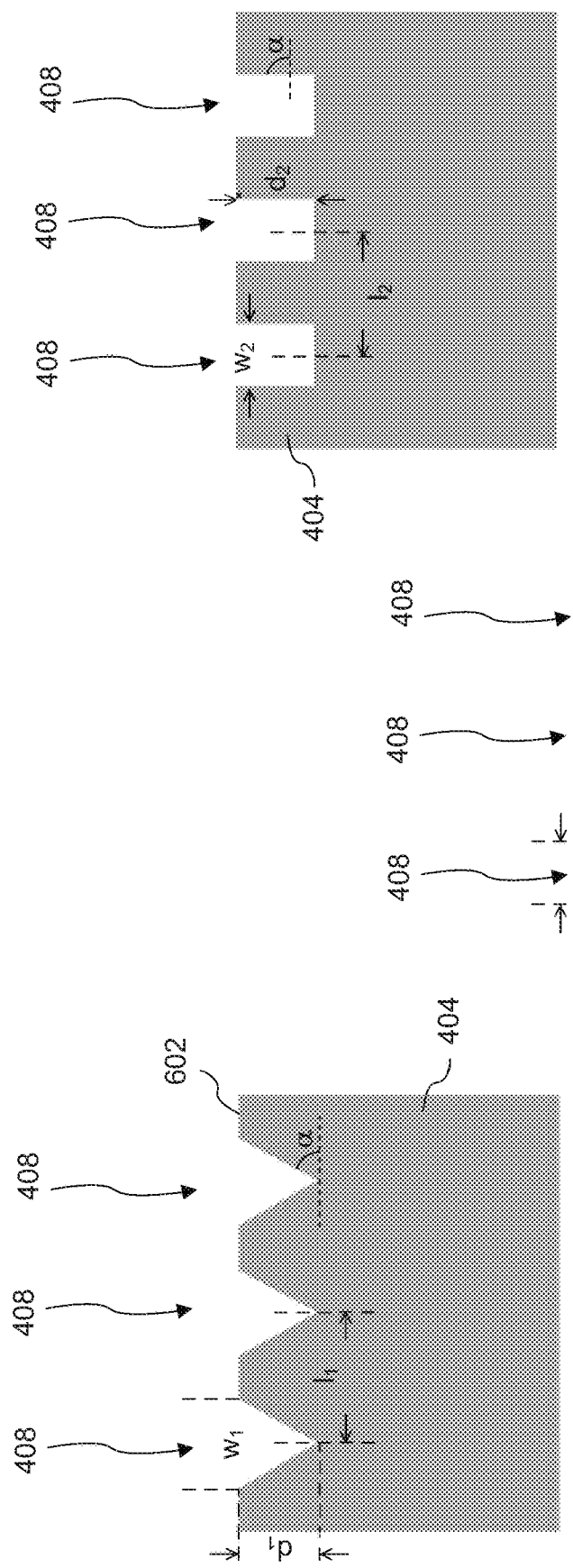
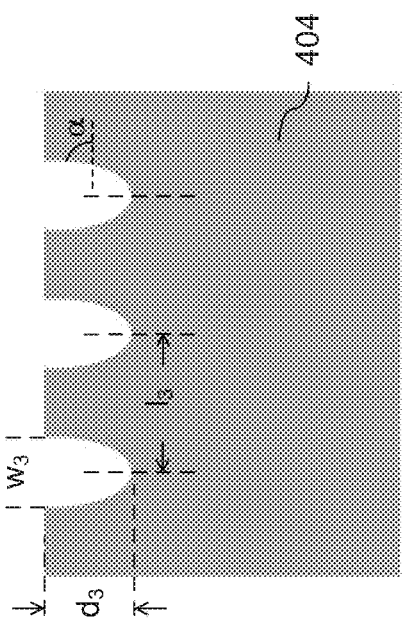
FIG. 6
FIG. 7
FIG. 8

IMAGE SENSOR WITH IMPROVED QUANTUM EFFICIENCY SURFACE STRUCTURE

CROSS-REFERENCE TO RELATED APPLICATION

This application is a divisional of U.S. Non-Provisional patent application Ser. No. 16/869,305, titled "Image Sensor with High Quantum Efficiency Surface Structure," filed May 7, 2020, which is a continuation of U.S. Non-Provisional patent application Ser. No. 16/866,215, titled "Image Sensor with High Quantum Efficiency Surface Structure," filed May 4, 2020, which is a divisional of U.S. Non-Provisional patent application Ser. No. 15/882,382, titled "Image Sensor with High Quantum Efficiency Surface Structure," filed Jan. 29, 2018, which claims the benefit of U.S. Provisional Patent Application No. 62/564,830, titled "Image Sensor with High Quantum Efficiency Surface Structure," filed Sep. 28, 2017, each of which is incorporated by reference herein in its entirety.

BACKGROUND

Semiconductor image sensors are used to sense radiation such as light. Complementary metal-oxide-semiconductor (CMOS) image sensors (CIS) and charge-coupled device (CCD) sensors are used in various applications such as digital still camera or mobile phone camera applications. These devices utilize an array of pixels (which may include photodiodes and transistors) in a substrate to absorb (e.g., sense) radiation that is projected toward the pixels and convert the sensed radiation into electrical signals. An example of an image sensor is a back side illuminated (BSI) image sensor device, which detects light from a backside of a substrate.

BRIEF DESCRIPTION OF THE DRAWINGS

Aspects of the present disclosure are best understood from the following detailed description when read with the accompanying figures. It is noted that, in accordance with the common practice in the industry, various features are not drawn to scale. In fact, the dimensions of the various features may be arbitrarily increased or reduced for clarity of illustration and discussion.

FIGS. 1-9 are cross-sectional views of an exemplary image sensor device with an improved quantum efficiency surface structure, in accordance with some embodiments.

DETAILED DESCRIPTION

Figure 1:
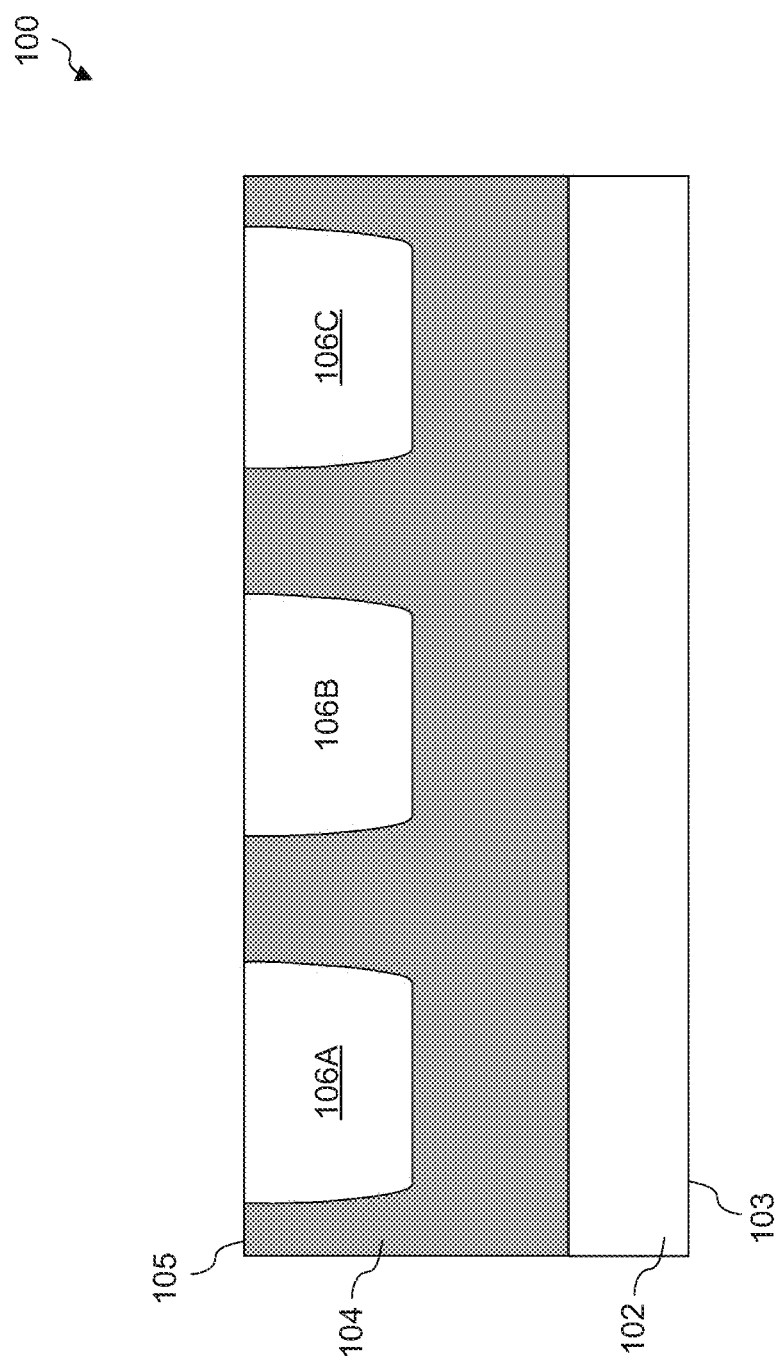

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over a second feature in the description that follows may include embodiments in which the first and second features are formed in direct contact, and may also include embodiments in which additional features are disposed between the first and second features, such that the first and second features are not in direct contact. In addition, the present disclosure may repeat reference numerals and/or letters in the various examples. This repetition does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The term "nominal" as used herein refers to a desired, or target, value of a characteristic or parameter for a component or a process operation, set during the design phase of a product or a process, together with a range of values above and/or below the desired value. The range of values can be due to variations in manufacturing processes or tolerances.

The term "substantially" as used herein indicates the value of a given quantity varies by ±5% of the value.

The term "about" as used herein indicates the value of a given quantity that can vary based on a particular technology node associated with the subject semiconductor device. Based on the particular technology node, the term "about" can indicate a value of a given quantity that varies within, for example, 10-30% of the value (e.g., ±10%, ±20%, or ±30% of the value).

A BSI image sensor device has a silicon substrate or semiconductor material layer in which light-sensing pixels are formed. A quantum efficiency of BSI image sensors can depend on the sensors' capability of absorbing incident light in a radiation-sensing region. BSI image sensors can include a planarized silicon surface that is compatible with process integration and control in semiconductor processes. However, the planarized surface can cause light to be reflected away from the radiation-sensing region, resulting in a reduced quantum efficiency of BSI image sensors.

Various embodiments in accordance with this disclosure describes forming a BSI image sensor with an improved quantum efficiency. By modifying the surface topography of the incident light area, the effective surface of the incident light area is increased without increasing device dimensions. The modified surface topography also provides as an equivalent gradient refractive index (GRIN) material which further improves light input efficiency by reducing reflections. In addition, the improved quantum efficiency BSI image sensor includes a backside deep trench isolation (BDTI) structure having increased depth that is embedded in a thick silicon layer to improve device isolation and reduce crosstalk within the silicon layer. The BDTI with increased depth provides improved isolation between pixel sensors (e.g., between adjacent pixel sensors) because the BDTI's trench depth is more than 50% of the silicon layer thickness. In accordance with some embodiments of this disclosure, the BSI image sensor provides improved quantum efficiency at least by incorporating: (i) a modified surface topography which includes a periodic groove pattern/structure to increase the effective surface of incident light area; (ii) an equivalent GRIN material formed by the modified surface topography to improve light input efficiency; and (iii) a BDTI structure with increased depth embedded in a thick silicon layer to improve device isolation and reduce crosstalk.

FIG. 1 is a cross-sectional view of a partially-fabricated image sensor device 100 having improved quantum efficiency after pixels are formed in a semiconductor layer, in accordance with some embodiments of the present disclosure. Image sensor device 100 is a semiconductor image sensor device. Partially-fabricated image sensor device 100 in FIG. 1 includes substrate 102, semiconductor layer 104, and pixels 106A-106C.

Substrate 102 can be a p-type substrate such as, for example, a silicon material doped with a p-type dopant such as boron. In some embodiments, substrate 102 can be an n-type substrate such as, for example, a silicon material doped with an n-type dopant such as phosphorous or arsenic. In some embodiments, substrate 102 can include, germanium, diamond, a compound semiconductor, an alloy semiconductor, a silicon-on-insulator (SOI) structure, any other suitable materials, and/or combinations thereof. Substrate 102 can have an initial thickness that is in a range from about 100 µm to about 3000 µm. Substrate 102 includes a back surface 103.

Semiconductor layer 104 is formed on substrate 102 and includes a semiconductor material such as, for example, silicon, germanium, a compound semiconductor, an alloy semiconductor, any other suitable semiconductor material, and/or combinations thereof. In some embodiments, semiconductor layer 104 can be an epitaxial material strained for performance enhancement. Semiconductor layer 104 includes a front surface 105. In some embodiments, semiconductor layer 104 has a thickness greater than 2 µm. In some embodiments, semiconductor layer 104 has a thickness greater than 3 µm. In some embodiments, the thickness of semiconductor layer 104 can be in a range between about 3 µm and about 10 µm (e.g., 3 µm to 10 µm). The thickness of semiconductor layer 104 can be determined by a variety of factors. For example, a greater thickness can improve the absorption of invisible light, in accordance with some embodiments. In some embodiments, a greater thickness may increase manufacturing costs.

Radiation-sensing regions—for example, pixels 106A-106C—are formed in the semiconductor layer 104. Pixels 106A-106C are configured to sense radiation (or radiation waves) such as incident light waves. Pixels 106A-106C each include a photodiode structure. In some embodiments, pixels 106A-106C can include pinned layer photodiodes, photogates, reset transistors, source follower transistors, transfer transistors, other suitable structures, and/or combinations thereof. Pixels 106A-106C can also be referred to as "radiation-detection devices" or "light-sensors." For simplicity purposes, three pixels 106A-106C are illustrated in FIG. 1; however any number of pixels may be implemented in semiconductor layer 104. In some embodiments, pixels 106A-106C are formed by performing an implantation process on semiconductor layer 104 from front surface 105. The implantation process can include doping semiconductor layer 104 with a p-type dopant such as boron. In some embodiments, the implantation process can include doping semiconductor layer 104 with an n-type dopant such as phosphorous or arsenic. In some embodiments, pixels 106A-106C can also be formed by a diffusion process.

Figure 2:
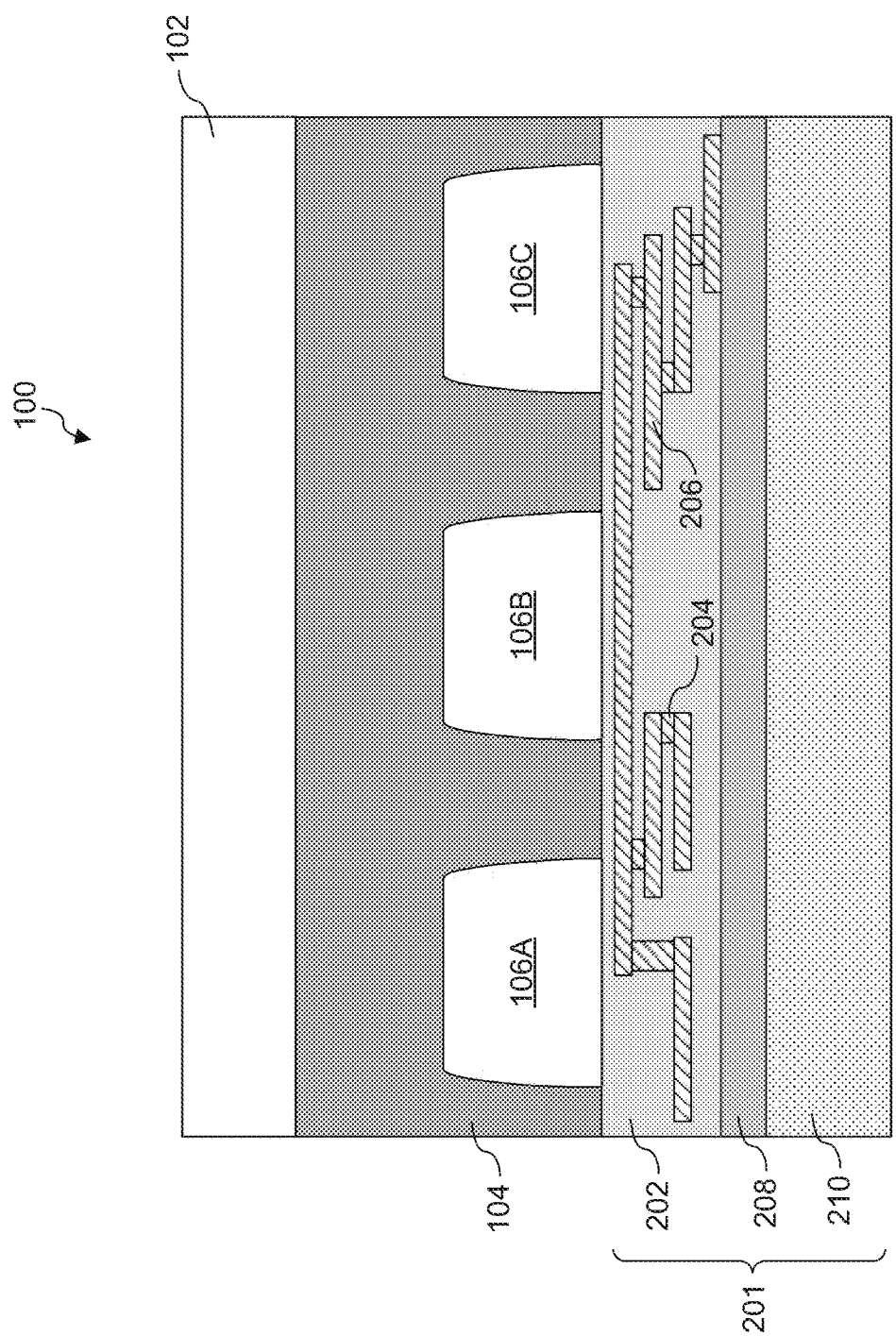

FIG. 2 is a cross-sectional view of a partially-fabricated image sensor device 100 having improved quantum efficiency after an interconnect structure is formed, in accordance with some embodiments of the present disclosure. The partially-fabricated image sensor device in FIG. 1 is flipped over and semiconductor layer 104 is wafer bonded to a carrier wafer 201 at front surface 105. In some embodiments, carrier wafer 201 is bonded to semiconductor layer 104 by a suitable bonding method such as, for example, fusion bonding, hybrid bonding, anodic bonding, direct bonding, other suitable bonding processes, and/or combinations thereof. Carrier wafer 201 can include an interlayer dielectric 202, conductive vias 204, conductive lines 206, a buffer layer 208, and a carrier substrate 210.

Interlayer dielectric 202 is disposed on (e.g., beneath) front surface 105 of the semiconductor layer 104. Conductive layers and structures that provide interconnections (e.g., wiring) between various doped features, circuitry, and input/output of the image sensor device 100 are embedded in interlayer dielectric 202. The conductive layers and structures can be parts of a multilayer interconnect (MLI) structure that includes contacts, vias, and/or metal lines. As shown in FIG. 2, vias 204 and conductive lines 206 are embedded in interlayer dielectric 202. Vias 204 and conductive lines 206 are provided as examples; other conductive structures can be included, in which the positioning and configuration of the MLI structure can vary depending on design needs. Vias 204 and conductive lines 206 can be formed of conductive materials such as, for example, copper, aluminum, tungsten, doped polysilicon, other suitable conductive material, and/or combinations thereof. The MLI structure can be electrically coupled to pixels 106A-106C. Other circuits and devices used to sense and process received light can also be embedded in interlayer dielectric 202 and are not illustrated for simplicity.

Buffer layer 208 can be formed using a dielectric material such as, for example, silicon oxide, silicon nitride, other suitable dielectric material, and/or combinations thereof. Buffer layer 208 can be formed by suitable deposition methods such as, for example, chemical vapor deposition (CVD), plasma-enhanced CVD (PECVD), atomic layer deposition (ALD), physical vapor deposition (PVD), any other suitable process, and/or combinations thereof. Buffer layer 208 can be planarized to form a smooth surface by a planarization process (e.g., a chemical mechanical polishing process). In some embodiments, buffer layer 208 provides electrical isolation between substrate 102 and carrier substrate 210.

Carrier wafer 201 provides mechanical support to the partially-fabricated image sensor device so that processes on back surface 103 can be performed. In some embodiments, carrier wafer 201 can be formed using a material similar to substrate 102. For example, carrier wafer 201 includes a silicon material. In some embodiments, carrier wafer 201 includes a glass substrate. In some embodiments, interlayer dielectric 202 is formed on semiconductor layer 104, and carrier substrate 210 is bonded onto interlayer dielectric 202 through buffer layer 208.

Figure 3:
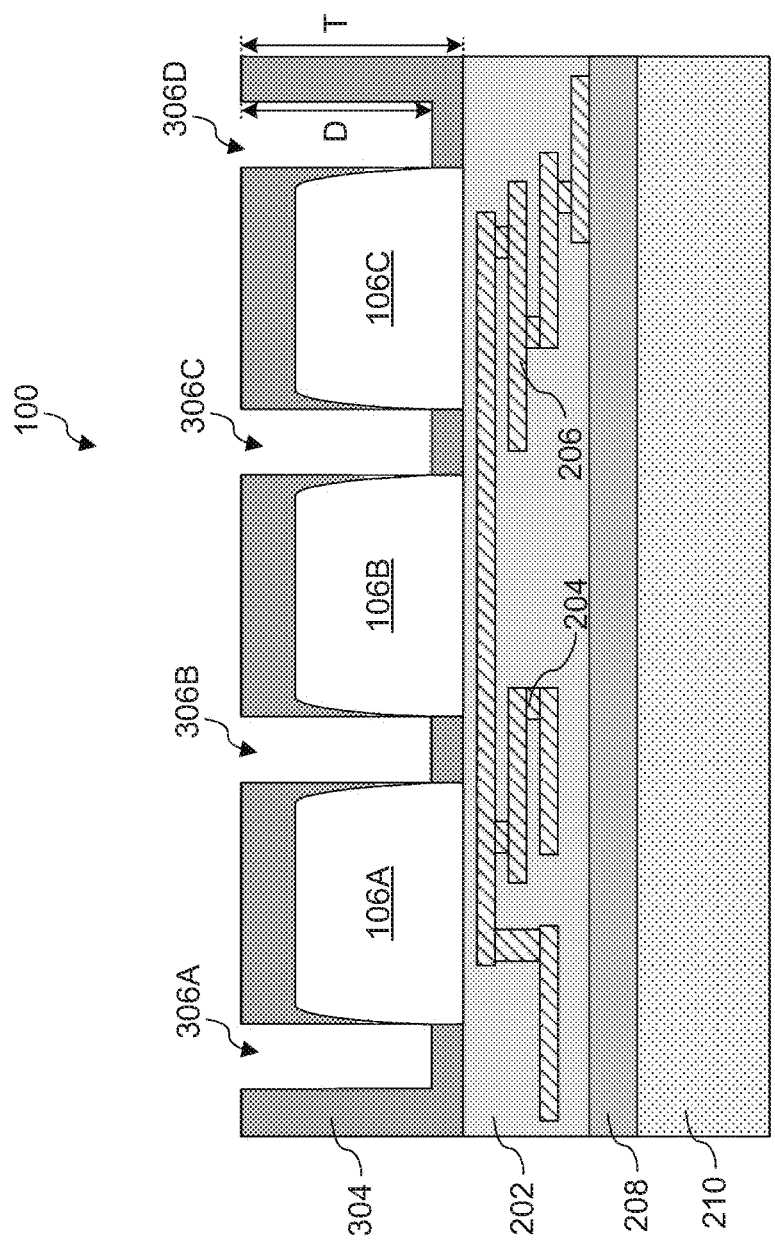

FIG. 3 is a cross-sectional view of an image sensor device 100 having improved quantum efficiency after trenches have been formed in a semiconductor layer, in accordance with some embodiments of the present disclosure. Partially-fabricated image sensor device 100 includes a patterned semiconductor layer 304 and trenches 306A-306D.

Substrate 102 is removed and semiconductor layer 104 can be thinned down prior to forming the trenches. Any suitable method to remove substrate 102 can be used such as, for example, a planarization process (e.g., chemical mechanical polishing), a wet etching method, a dry etching method, other suitable methods, and/or combinations thereof.

After substrate 102 is removed, semiconductor layer 104 is thinned down and patterned to form trenches 306A-306D between pixels. Any suitable method to thin down semiconductor layer 104 can be used such as, for example, a planarization process (e.g., chemical mechanical polishing), a wet etching method, a dry etching method, other suitable methods, and/or combinations thereof. Patterned semiconductor layer 304 is formed after semiconductor layer 104 has been thinned down and patterned. In some embodiments, trenches 306A-306D are formed in semiconductor layer 104 without semiconductor layer 104 being thinned down further. As shown in FIG. 3, patterned semiconductor layer 304 has a thickness T that can be in a range between about 2 μm to about 10 μm. In some embodiments, the depth D of trenches 306A-306D can be greater than half of the thickness T of the semiconductor layer 104. In some embodiments, trenches can be high aspect ratio trenches such as, for example, trenches having an aspect ratio greater than 6. The etching process of trenches 306A-306D can be a timed etching process where the etching process continues until nominal depths of the trenches are achieved such as, for example, a nominal depth of greater than half the thickness of the semiconductor layer. In some embodiments, a depth of the trenches can be substantially equal to that of a thickness of semiconductor layer 104.

Figure 4:
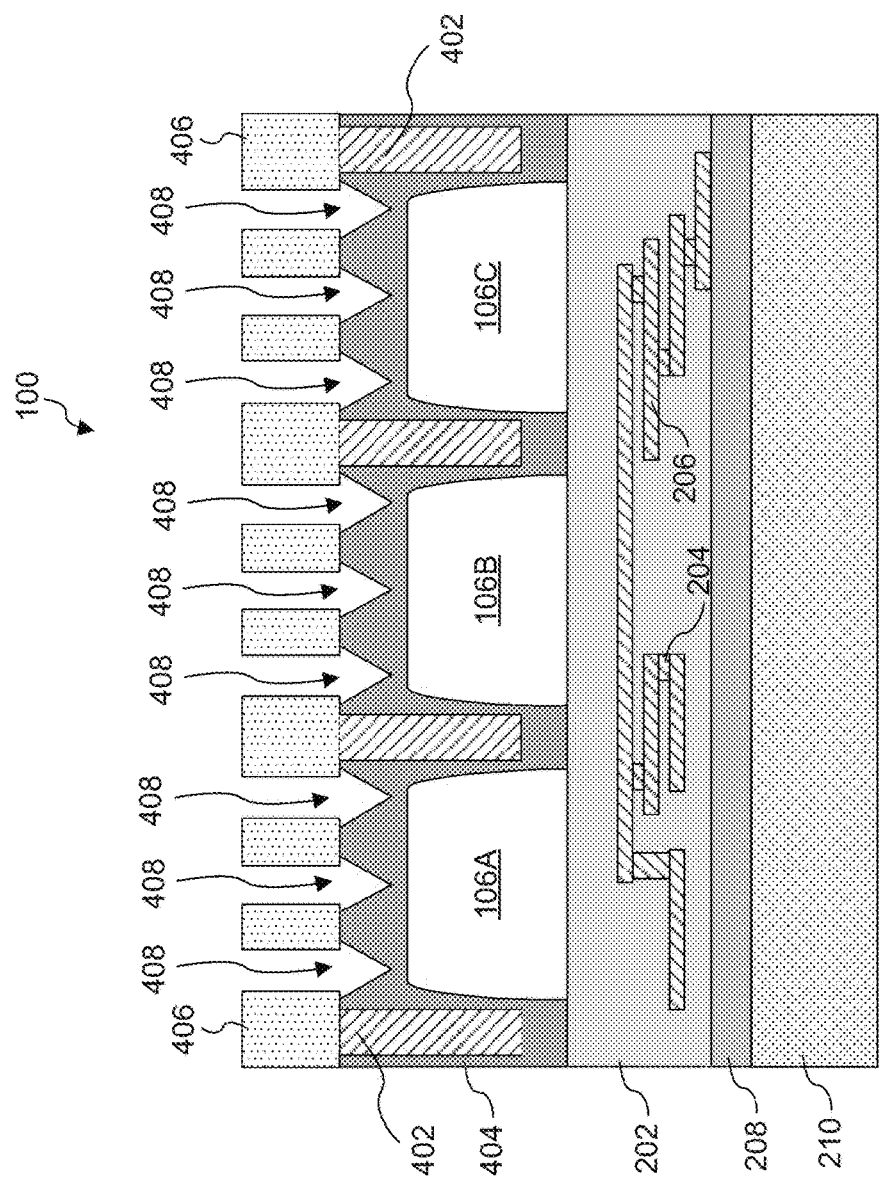

FIG. 4 is a cross-sectional view of an image sensor device 100 having improved quantum efficiency after grooves are formed on a top surface of a patterned semiconductor layer, in accordance with some embodiments of the present disclosure.

Plugs 402 are first deposited to fill the trenches 306A-306D of FIG. 3. Plugs 402 can use any suitable material such as a dielectric material. In some embodiments, plugs 402 can include an epoxy-based polymer. In some embodiments, plugs 402 can include a resin material. The plug material is deposited using a blanket deposition followed by a planarization process such that top surfaces of the deposited plug material in the trenches are coplanar with a top surface of patterned semiconductor layer 304 of FIG. 3. Plugs 402 are used to fill the trenches such that after the planarization process a coplanar top surface of plugs 402 and patterned semiconductor layer 304 are ready for a deposition of a hard mask layer.

A hard mask material is deposited on the planar top surfaces of plugs 402 and patterned to form a patterned hard mask layer 406, where portions of patterned semiconductor layer 304 are exposed. In some embodiments, the hard mask material is made of a dielectric material such as, for example, silicon nitride. The hard mask material can be deposited using any suitable deposition method such as, for example, chemical vapor deposition (CVD), plasma-enhanced CVD (PECVD), atomic layer deposition (ALD), any other suitable process, and/or combinations thereof.

Exposed portions of patterned semiconductor layer 304 not covered by the patterned hard mask layer 406 are etched to form a periodic pattern of groove structures such as grooves 408. After the etching process, patterned semiconductor layer 304 becomes grooved semiconductor layer 404. As shown in FIG. 4, grooves 408 forms a periodic groove pattern on the top surface of grooved semiconductor layer 404 and between plugs 402. As a result, grooves 408 alter the surface topography of the semiconductor material between plugs 402 such that additional surface area of the semiconductor material is exposed between plugs 402 as compared to a planar surface of the semiconductor layer. In other words, in some embodiments, grooves 408 provide an increase in exposed area per horizontal unit area that can be achieved without adjusting the separation between plugs 402. Increasing the exposed surface area increases the effective light incident area of the semiconductor material and in turn increases the incident light intensity received by pixels 106A-106C. As a result, the quantum efficiency of the pixels is improved. In addition, various groove designs of the present disclosure can enable multiple reflections of incident light within the groove-which, in turn, increases the likelihood of incident light being absorbed by pixels 106A-106C. For example, by choosing a nominal sidewall angle of the groove, light can be reflected multiple times at the sidewalls without leaving the groove, thus increasing the portions of light absorbed by the semiconductor material. In addition, sidewall angles of the groove structure can vary from a top portion to a bottom portion of the groove structure. According to the Fresnel equations, reflection and transmission coefficients of light travelling between media of different refractive indices can vary with respect to the incident angle of light. When light is travelling into semiconductor layer 304, the groove structure can have a gradient change of equivalent refractive index from the top portion to the bottom portion within the groove structure due to the gradient change of groove structure sidewall angles. Therefore, the groove structure can provide an equivalent gradient refractive index (GRIN) material that reduces Fresnel reflection by creating an equivalent gradient refractive index region. As a result, quantum efficiency can be improved by reducing the Fresnel reflection at the semiconductor layer 304 interface.

As shown in FIG. 4, each groove 408 of the periodic pattern of groove structures can have a triangular-shaped cross-sectional profile. In some embodiments, other cross-sectional profile shapes can be used and achieved through suitable etching processes and material properties of grooved semiconductor layer 404. In some embodiments, the triangular-shaped cross-sectional profile of grooves 408 can be formed by first using an anisotropic dry etching process followed by a wet etching process. The anisotropic dry etching process can form groove structures with a rectangular-shaped cross-sectional profile. The chemical wet etching process can etch the rectangular-shaped semiconductor layer 404 based on the chemical property of the etchant and the crystal orientation of the semiconductor material being etched; therefore, different etching profiles can be achieved (e.g., resulting in the triangular-shaped cross-sectional profile).

In some embodiments, grooved semiconductor layer 404 can be formed of silicon using a (111) orientation. In some embodiments, grooved semiconductor layer 404 can be formed of silicon using crystal orientations such as, for example, (100), (110), or any other suitable orientations. In some embodiments, the dry etching process can be a fluorine-based etching process, a chlorine-based etching process, any other suitable process, and/or combinations thereof. In some embodiments, the wet etching process can use a fluoric acid based chemical etchant, a nitric acid based chemical etchant, any other suitable etchant, and/or combinations thereof. In some embodiments, the wet etching process can etch semiconductor layer 304 in an isotropic fashion and a portion of patterned semiconductor layer 304 under patterned hard mask layer 406. Additional details of the various etching profiles are discussed below in FIGS. 6-8.

Figure 5:
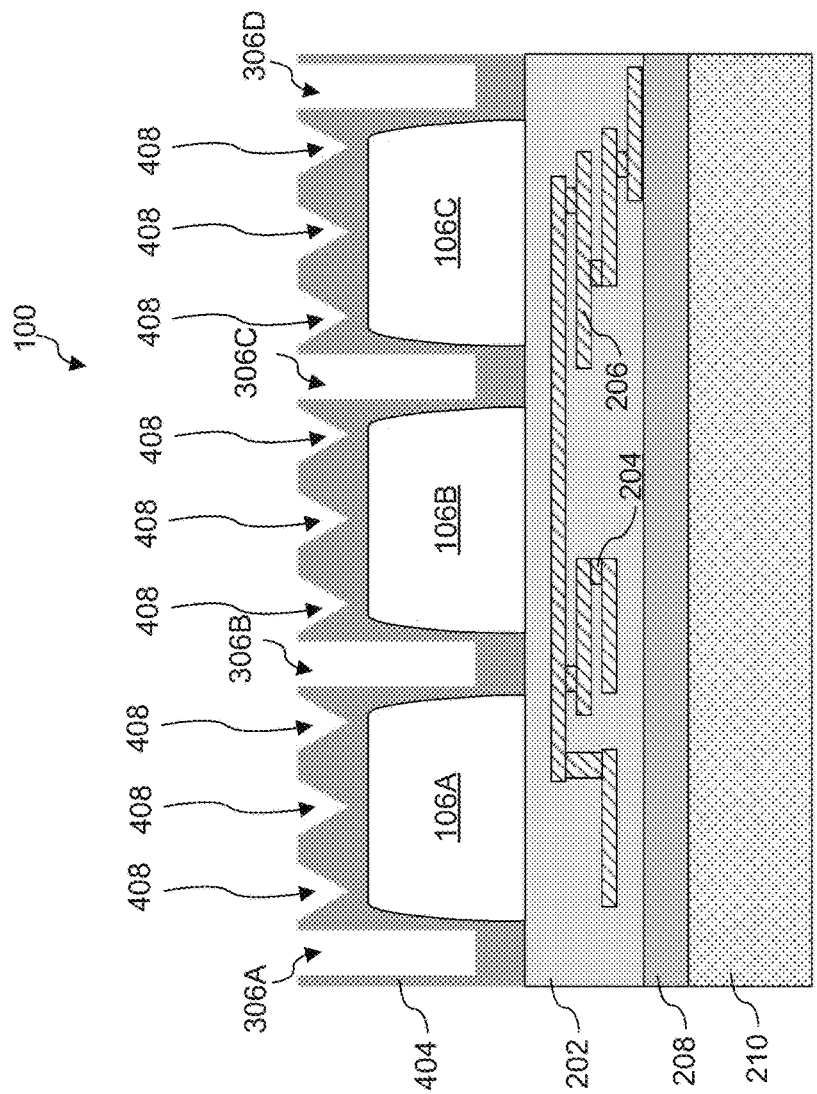

FIG. 5 is a cross-sectional view of an image sensor device 100 having improved quantum efficiency after the plugs and the patterned hard mask layer are removed, in accordance with some embodiments of the present disclosure. Plugs 402 and patterned hard mask layer 406 can be removed using any suitable process such as, for example, a planarization process (e.g., CMP process), a wet etching process, a dry etching process, other suitable removal processes, and/or combinations thereof. The removal process can be selected such that grooved semiconductor layer 404 is not etched during the removal processes.

After the removal processes, trenches 306A-306D reappear in image sensor device 100. In some embodiments, after the patterned hard mask layer is removed, a second wet etching process can be performed on the grooved semiconductor layer to achieve a nominal cross-sectional profile for the grooves. In some embodiments, the second wet etching process can use substantially similar chemical etchants as the wet etching process described with reference to FIG. 4. In some embodiments, the second wet etching process can use different chemical etchants. In some embodiments, the second wet etching process can be used to refine the etch profile and can be performed for a shorter period of time than the wet etching process described in FIG. 4. For example, the second wet etching process can be used to achieve substantially planar surfaces between grooves 408.

FIGS. 6-8 are cross-sectional views of different groove designs for an image sensor device 100 having improved quantum efficiency after the plugs and the patterned hard mask layer are removed, in accordance with some embodiments of the present disclosure.

FIG. 6 is a cross-sectional view of grooves 408 having a triangular-shaped cross-sectional profile. As illustrated in FIG. 6, each groove 408 has a depth $d_1$, a width $w_1$, and an angle α with reference to the sidewall surface and a direction in parallel to top surface 602 of the grooved semiconductor layer 404. Angle α can be measured at different locations within the groove. A pitch between adjacent grooves 408 can be measured from the center of the triangle and is labeled as $l_1$. In some embodiments, depth $d_1$ can be in a range of about 20 nm to about 500 nm (e.g., 20 nm to 500 nm), pitch $l_1$ can be in a range of about 0.1 μm to about 0.5 μm (e.g., 0.1 μm to 0.5 μm), and angle α can be in a range of about 450 to about 60° (e.g., 45° to 60°). By choosing a nominal sidewall angle (e.g., angle α) of the groove, light can be reflected multiple times at the sidewalls without leaving grooves 408. At each reflection, light would be absorbed into the semiconductor material thus increasing quantum efficiency by increasing the amount of light absorbed and processed by pixels 106A-106C.

FIG. 7 is a cross-sectional view of grooves 408 having a rectangular-shaped cross-sectional profile. As illustrated in FIG. 7, each groove 408 has a depth $d_2$ and a width $w_2$. A pitch between adjacent grooves 408 can be measured from the center of the rectangle and is labeled as $l_2$. In some embodiments, depth $d_2$ and width $w_2$ can each be in a range of about 20 nm to about 500 nm (e.g., 20 nm to 500 nm), and pitch $l_2$ can be in a range of about 0.1 μm to about 0.5 μm (e.g., 0.1 μm to 0.5 μm). Similar to angle α described in FIG. 6, angle α in FIG. 7 (not shown) can be measured at different locations on the sidewall within grooves 408.

FIG. 8 is a cross-sectional view of grooves 408 having a semi-oval shaped cross-sectional profile. As illustrated in FIG. 8, each groove 408 has a depth $d_3$ and a width $w_3$. A pitch between adjacent grooves 408 can be measured from the center of the semi-oval shape and is labeled as $l_3$. In some embodiments, depth $d_3$ and width $w_3$ can be in a range of about 20 nm to about 500 nm (e.g., 20 nm to 500 nm), and pitch $l_3$ can be in a range of about 0.1 μm to about 0.5 μm (e.g., 0.1 μm to 0.5 μm). Similar to angle α described in FIG. 6, angle α in FIG. 8 (not shown) can be measured at different locations on the sidewall within grooves 408.

For grooves 408 with triangular, rectangular, semi-oval shaped cross-sectional profiles and with other suitable cross-sectional profiles, angle α is an angle measured at a given location on the groove sidewall with reference to the sidewall surface and a direction in parallel to top surface 602. In some embodiments, angle α can vary from a top portion to a bottom portion of grooves 408 and the grooves can act as an equivalent GRIN material that reduces Fresnel reflection by creating an equivalent gradient refractive index region which in turn provides an improved quantum efficiency.

Figure 9:
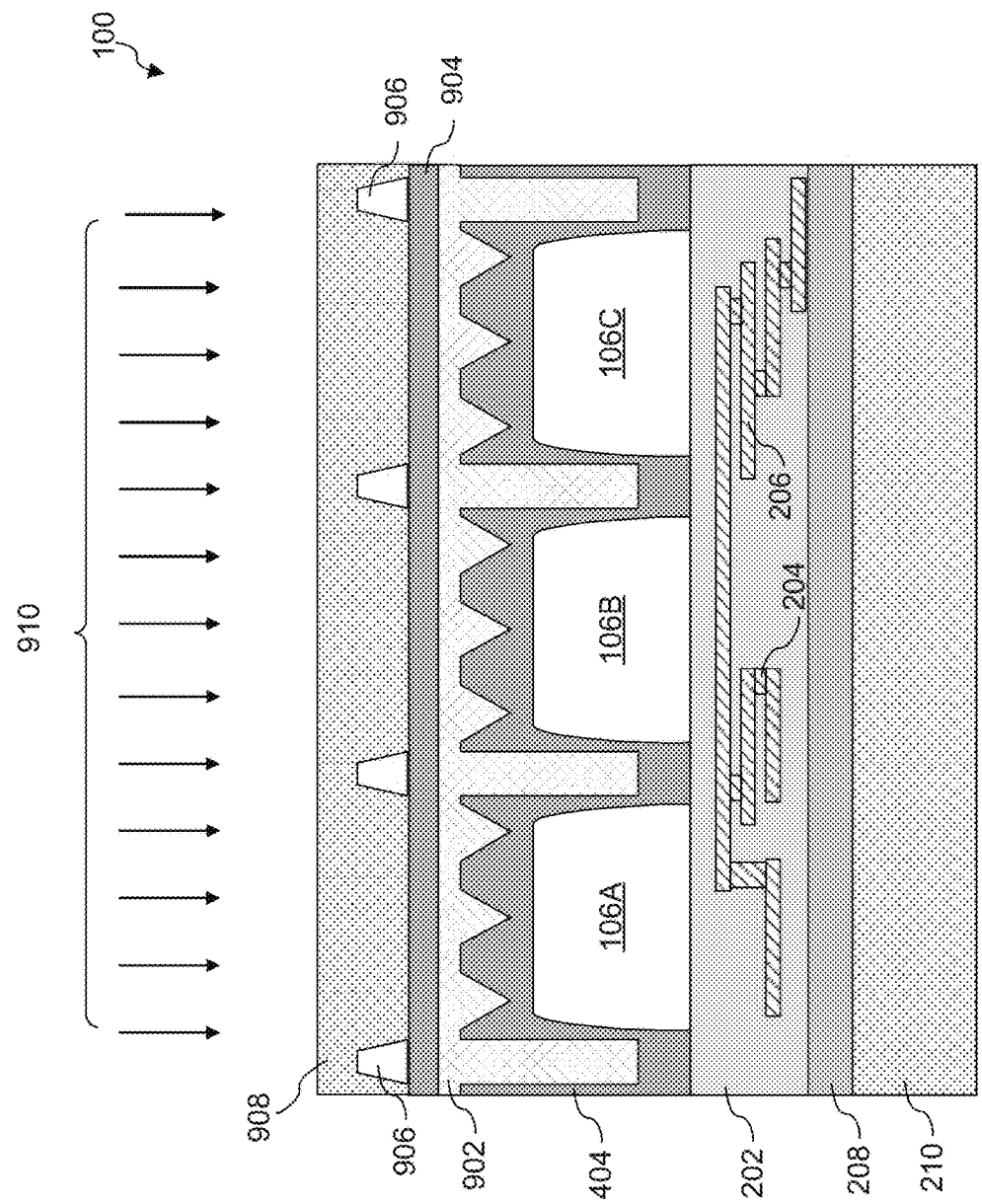

FIG. 9 is a cross-sectional view of an image sensor device 100 having improved quantum efficiency after a passivation layer and other structures are formed, in accordance with some embodiments of the present disclosure. Image sensor device 100 can include a gap fill 902, a buffer layer 904, grid structures 906, and a passivation layer 908.

Gap fill 902 is formed over grooved semiconductor layer 404 by a blanket deposition followed by a planarization process. Gap fill 902 fills trenches 306A-306D, grooves 408, and other exposed surfaces of grooved semiconductor layer 404. Gap fill 902 can be formed using any suitable dielectric material such as, for example, silicon oxide, silicon nitride, other suitable dielectric material, and/or combinations thereof. In some embodiments, a liner layer (not shown) is formed between grooved semiconductor layer 404 and gap fill 902. The liner layer can be formed using a high-k dielectric material such as, for example, hafnium oxide ($HfO_2$), tantalum pentoxide ($Ta_2O_5$), zirconium dioxide ($ZrO_2$), aluminum oxide ($Al_2O_3$), other high-k material, and/or combinations thereof. The material for gap fill 902 can be deposited using any suitable deposition method such as, for example, atomic layer deposition (ALD), molecular beam epitaxy (MBE), high density plasma CVD (HDPCVD), metal organic (MOCVD), remote plasma CVD (RPCVD), plasma-enhanced CVD (PECVD), plating, other suitable methods, and/or combinations thereof. After gap fill material is deposited, a planarization process such as, for example, a chemical mechanical polishing process is performed on the deposited gap fill material to form a planar top surface of gap fill 902. In some embodiments, gap fill 902 is deposited into trenches 306A-306D to form BDTI and to prevent crosstalk between pixels (e.g., between adjacent pixels). As described above with reference to FIG. 3, trenches 306A-306D can be high aspect ratio trenches that have depths D greater than half the thickness T of patterned semiconductor layer 304.

In some embodiments, a buffer layer 904 can be formed on the top surface of gap fill 902. A buffer material is blanket deposited followed by a planarization process to form buffer layer 904 and provide a planar top surface for one or more subsequent fabrication processes. In some embodiments, buffer layer 904 can be the same dielectric material as gap fill 902. In some embodiments, buffer layer 904 be a different dielectric material.

Grid structures 906 are formed on buffer layer 904. In some embodiments, grid structures 906 can be formed by depositing a metal layer on buffer layer 904 and performing a patterning process. Grid structures 906 can be used for reducing crosstalk between pixels (e.g., between adjacent pixels) and can include a metal grid used to reflect light towards corresponding pixels 106A-106C. In some embodiments, grid structures 906 are formed using metal such as, for example, copper, tungsten, aluminum, other suitable metal, and/or combinations thereof. In some embodiments, grid structures 906 is formed using any material that has a high reflective property. In some embodiments, grid structures 906 can have a stacked structure, in which additional dielectric grid structures formed on grid structures 906. In some embodiments, each of grid structures 906 can have a height of about 200 nm to about 300 nm (e.g., 200 nm to 300 nm). For example, grid structure 906 can have a height of about 250 nm.

Passivation layer 908 is formed on buffer layer 904 and grid structures 906. Passivation layer 908 can be formed by blanket depositing a dielectric layer on buffer layer 904 and grid structures 906. In some embodiments, passivation layer 908 can have a thickness of about 400 nm to about 600 nm. For example, passivation layer 908 can have a thickness of about 500 nm.

Pixels 106A-106C are configured to sense radiation (or radiation waves), such as an incident light 910 that is projected towards passivation layer 908. Incident light 910 enters the image sensor device 100 through the back surface and can be detected by one or more of the pixels 106A-106C. In some embodiments, in addition to detecting visible light, image sensor device 100 can also be used to detect non-visible light due to the increased depth of grooved semiconductor material and reduced crosstalk between pixels.

Figure 10:
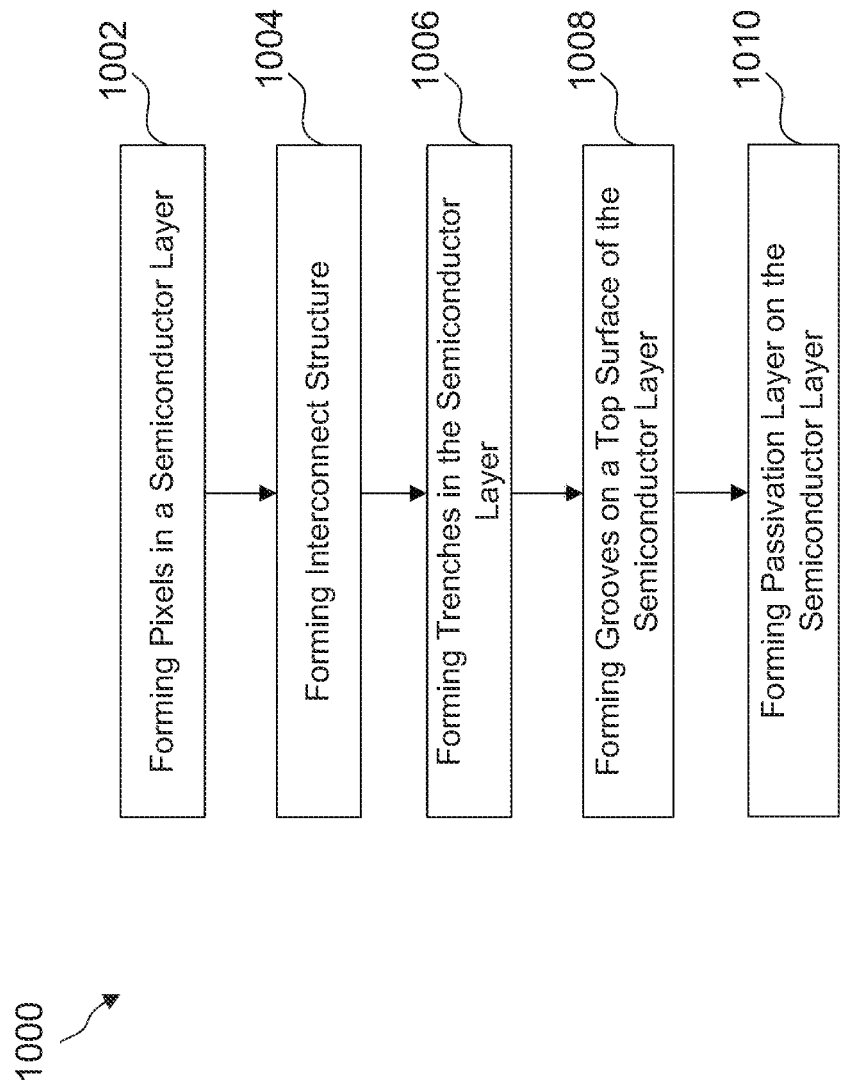
FIGS. 10-11 are flow diagrams of exemplary methods for forming an image sensor device with improved quantum efficiency surface structure, in accordance with some embodiments.

FIG. 10 is a flow diagram of an exemplary method 1000 for forming an image sensor device having improved quantum efficiency, in accordance with some embodiments of the present disclosure. Other operations in exemplary method 1000 can be performed and operations of method 1000 can be performed in a different order and/or vary.

At operation 1002, pixels are formed in a semiconductor layer and over a substrate, in accordance with some embodiments. The substrate can be a p-type substrate or an n-type substrate. The substrate can have an initial thickness that is in a range from about 100 μm to about 3000 μm. A semiconductor layer can be formed on the substrate. In some embodiments, the semiconductor layer can be an epitaxial material strained for performance enhancement. In some embodiments, the semiconductor layer has a thickness greater than 2 μm. The pixels can be formed in the semiconductor layer and configured to sense radiation such as incident light waves. In some embodiments, the pixels are capable of sensing non-visible light. The pixels can each include a photodiode structure. Examples of the substrate, the semiconductor layer, and the pixels can be respective substrate 102, semiconductor layer 104, and pixels 106A-106C are described above with reference to FIG. 1.

At operation 1004, an interconnect structure is formed, in accordance with some embodiments. A carrier wafer including the interconnect structure can be bonded to the semiconductor layer. The semiconductor layer can be wafer bonded to the carrier wafer by any suitable bonding method such as, for example, fusion bonding, hybrid bonding, other suitable bonding methods, and/or combinations thereof. The carrier wafer can include an interlayer dielectric, conductive vias, conductive lines, a buffer layer, and a carrier substrate. An example of the carrier wafer and its components can be carrier wafer 201 and its corresponding components described in FIG. 2. The interlayer dielectric can be formed on the semiconductor layer. Conductive layers and structures that provide interconnections between various features, circuitry, and input/output of the image sensor device can be embedded in the interlayer dielectric. Examples of the conductive layers and structures can be vias 204 and conductive lines 206 described above with reference to FIG. 2.

At operation 1006, trenches are formed in the semiconductor layer, in accordance with some embodiments. The substrate is removed and the semiconductor layer can be thinned down prior to forming the trenches. The trenches are formed between pixels and the depth of the trenches can be greater than half of the thickness of the semiconductor layer. In some embodiments, the semiconductor layer can have a thickness in a range of between about 2 μm to about 10 μm. Examples of the trenches can be trenches 306A-306D described above in FIG. 3.

At operation 1008, grooves are formed on a top surface of the semiconductor layer, in accordance with some embodiments. Plugs are deposited to fill the trenches (formed in operation 1006) such that after a planarization process a coplanar top surface of plug material and semiconductor layer is ready for a deposition of a hard mask layer. A hard mask material is then deposited on the planar top surface and patterned to form a patterned hard mask layer where portions of semiconductor layer are exposed. Examples of plugs and patterned hard mask layer can be plug 402 and patterned hard mask layer 406 described in FIG. 4.

Exposed portions of the semiconductor layer not covered by the patterned hard mask layer are etched to form a periodic pattern of groove structures. The grooves form a periodic groove pattern on the top surface of the semiconductor layer, in which the grooves are located between plugs. As a result, the grooves alter the surface topography of the semiconductor material between the plugs such that additional semiconductor material surface area is exposed compared to a planar surface. The additional surface area is achieved without enlarging the separation between the plugs. Increasing the exposed surface area increases the effective light incident area of the semiconductor material and in turn increases the incident light intensity received by pixels, thus improving the quantum efficiency of the pixels. In addition, various groove designs of the present disclosure can enable multiple reflections of incident light within the groove. The multiple reflections increase the likelihood of incident light being absorbed by the pixels, thus also improving the quantum efficiency. The modified surface topography also provides an equivalent gradient refractive index (GRIN) material, which further improves light input efficiency by reducing reflections.

In some embodiments, nominal groove profiles can be achieved by using an anisotropic dry etching process followed by a wet etching process. The anisotropic dry etching process can form groove structures with a rectangular-shaped cross-sectional profile. A chemical wet etching process etches the semiconductor material of the rectangular-shaped semiconductor layer based on the chemical property of the etchant and the crystal orientation of the semiconductor material being etched. The etching rate and etching direction are based on the specific chemical nature of the selected etchant and the crystal orientation of the semiconductor material being etched; therefore, different etching profiles can be achieved. Examples of different groove cross-sectional profiles and corresponding etching processes and material compositions can be found above with references to FIGS. 4-8.

At operation 1010, a passivation layer and other structures are formed on the semiconductor layer, in accordance with some embodiments. A gap fill material is formed over the semiconductor layer and fills the trenches and grooves. In some embodiments, a liner layer is formed between the semiconductor layer and gap fill material and formed using a high-k dielectric material. After the gap fill material is deposited, a planarization process can be performed on the deposited gap fill material to form a planar top surface. Gap fill material deposited into trenches form BDTI can prevent crosstalk between pixels (e.g., between adjacent pixels). Because the trenches can have a high aspect ratio with depths greater than half the thickness of the semiconductor layer, the gap fill material provides depth coverage that is more than half the thickness of the semiconductor layer, resulting in isolation and prevention of crosstalk between pixels (e.g., between adjacent pixels).

Figure 11:
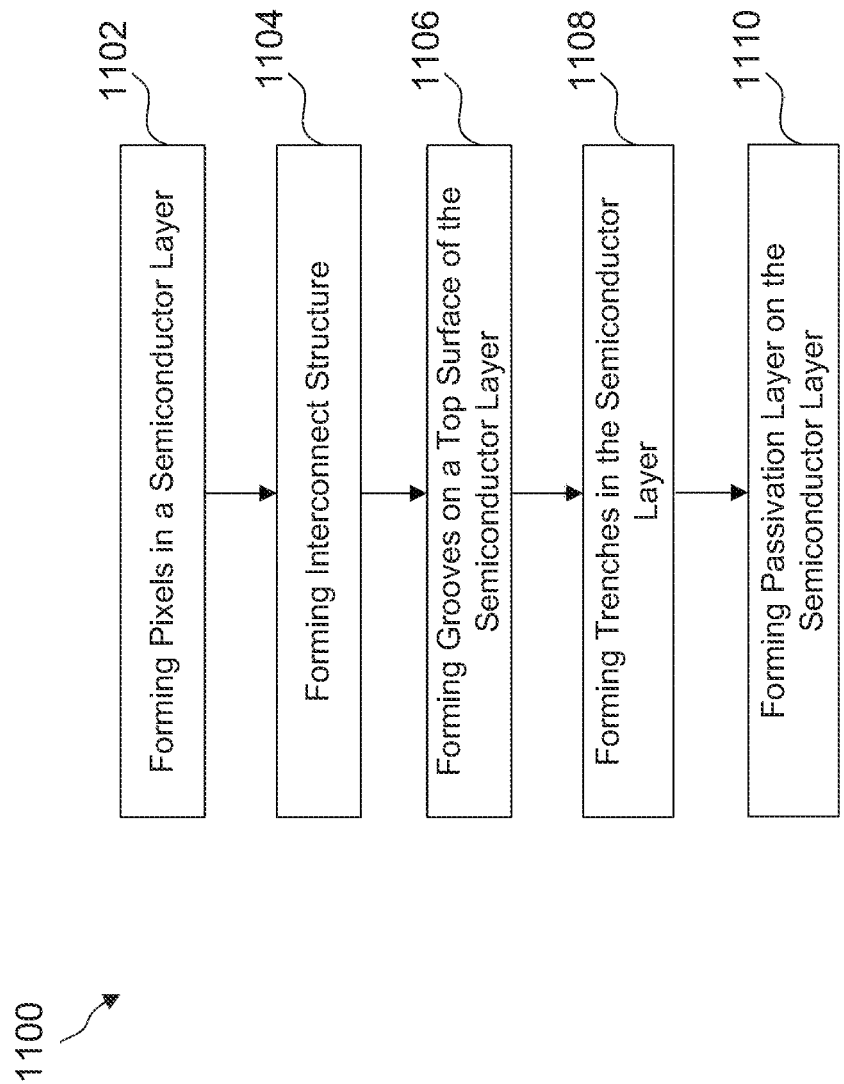

FIG. 11 is a flow diagram of an exemplary method 1100 for forming an image sensor device having improved quantum efficiency, in accordance with some embodiments of the present disclosure. Other operations in exemplary method 1100 can be performed, and operations of method 1000 can be performed in a different order and/or vary.

At operation 1102, pixels are formed in a semiconductor layer and over a substrate, in accordance with some embodiments. At operation 1104, an interconnect structure is formed, in accordance with some embodiments. In some embodiments, operations 1102 and 1104 can be respectively similar to operations 1002 and 1004 described above with reference to exemplary method 1000 in FIG. 10. In some embodiments, operations 1102 and 1104 can be different from operations 1002 and 1004.

At operation 1106, grooves are formed on a top surface of the semiconductor layer, in accordance with some embodiments. A hard mask material is deposited on a planar top surface of a semiconductor layer and patterned to form a patterned hard mask layer where portions of semiconductor layer are exposed. Exposed portions of the semiconductor layer not covered by the patterned hard mask layer are etched to form a periodic pattern of groove structures. The grooves form a periodic groove pattern on the top surface of the semiconductor layer, in which the grooves are located between plugs. As a result, the grooves alter the surface topography of the semiconductor material between the plugs such that additional semiconductor material surface area is exposed compared to a planar surface. The additional surface area is achieved without enlarging the separation between the plugs. The additional surface areas can improve quantum efficiency of the pixels in ways similar to the improved quantum efficiency effect described above with reference to FIG. 4. In addition, various groove designs of the present disclosure can enable multiple reflections of incident light within the groove. The multiple reflections increase the likelihood of incident light being absorbed by the pixels, thus also improving the quantum efficiency. The modified surface topography also provides as an equivalent GRIN material, which further improves light input efficiency by reducing reflections. In some embodiments, nominal groove profiles can be achieved by using an anisotropic dry etching process followed by a wet etching process. The anisotropic dry etching process and the chemical wet etching process can be similar to the etching processes described above in FIG. 4. Examples of different groove cross-sectional profiles and corresponding etching processes and material compositions can be found above with references to FIGS. 4-8.

At operation 1108, trenches are formed in the semiconductor layer, in accordance with some embodiments. The substrate is removed and the semiconductor layer can be thinned down prior to forming the trenches. Trenches are formed between pixels and the depth of the trenches can be greater than half of the thickness of the semiconductor layer. In some embodiments, the semiconductor layer can have a thickness in a range between about 2 µm to about 10 µm. In some embodiments, a depth of the trenches can be substantially equal to that of a thickness of semiconductor layer. Plugs are deposited to fill the trenches such that after a planarization process a coplanar top surface of plug material and semiconductor layer is formed.

At operation 1110, a passivation layer and other structures are formed on the semiconductor layer, in accordance with some embodiments. In some embodiments, operation 1110 can be similar to operation 1010 described above in FIG. 10. In some embodiments, operation 1110 can be different from operation 1010.

A buffer layer and grid structures can be formed over the top surface of gap fill material. The buffer layer can be formed using a dielectric material and can provide a planar top surface for one or more subsequent fabrication process. The grid structures are formed on the buffer layer and can reduce crosstalk between pixels (e.g., between adjacent pixels). The grid structures can include a metal grid used to reflect light towards corresponding pixels and can also include dielectric grid structures formed on the metal grid. A passivation layer can be formed on the buffer layer and the grid structures.

The present disclosure describes forming a BSI image sensor with an improved quantum efficiency. Effective surface of the incident light area is increased without increasing device dimensions by modifying the surface topography of the incident light area. The modified surface topography also provides as an equivalent gradient refractive index (GRIN) material which further improves light input efficiency by reducing reflections. In addition, the improved quantum efficiency BSI image sensor includes a backside deep trench isolation (BDTI) structure having increased depth that is embedded in a thick silicon layer to improve device isolation and reduce crosstalk within the silicon layer. The BDTI with increased depth provides improved isolation between pixel sensors (e.g., between adjacent pixel sensors) because the BDTI's trench depth is more than 50% of the silicon layer thickness. The BSI image sensor provides improved quantum efficiency at least by incorporating a modified surface topography which includes a periodic groove pattern/structure to increase the effective surface of incident light area. A BDTI structure with increased depth can be embedded in a thick silicon layer to improve device isolation and reduce crosstalk.

In some embodiments, a semiconductor image sensor device includes a semiconductor layer having a first surface and a second surface opposite of the first surface. An interconnect structure is disposed on the first surface of the semiconductor layer. A plurality of radiation-sensing regions are formed in the semiconductor layer and are configured to sense radiation that enters the semiconductor layer from the second surface. The semiconductor image sensor device further includes a plurality of groove structures that formed on the second surface of the semiconductor layer.

In some embodiments, a semiconductor image sensor device includes a semiconductor layer having a front side and a back side opposite of the front side. The back side of the semiconductor layer includes a plurality of groove structures. A plurality of pixels are formed in the semiconductor layer, and the plurality of pixels are configured to detect light that enters the semiconductor layer at least through the plurality of groove structures. The semiconductor image sensor device further includes a plurality of isolation structures and at least one of the isolation structures is disposed between two pixels of the plurality of pixels and has depth of at least half of a thickness of the semiconductor layer.

In some embodiments, a method of forming a semiconductor image sensor device, the method includes forming a plurality of pixels in a semiconductor layer. The semiconductor layer has a first surface and a second surface opposite of the first surface. The method further includes disposing an interconnect structure on the second surface of the semiconductor layer and depositing and patterning a hard mask layer over the first surface of the semiconductor layer. The patterned hard mask layer exposes portions of the first surface over the plurality of pixels. A first etching process is performed on the exposed portions of the semiconductor layer. A second etching process is performed on the exposed portions of the semiconductor layer. The first and second etching processes form a plurality of grooves in the first surface of the semiconductor layer.

It is to be appreciated that the Detailed Description section, and not the Abstract of the Disclosure, is intended to be used to interpret the claims. The Abstract of the Disclosure section may set forth one or more but not all exemplary embodiments contemplated and thus, are not intended to be limiting to the subjoined claims.

The foregoing disclosure outlines features of several embodiments so that those skilled in the art may better understand the aspects of the present disclosure. Those skilled in the art will appreciate that they may readily use the present disclosure as a basis for designing or modifying other processes and structures for carrying out the same purposes and/or achieving the same advantages of the embodiments introduced herein. Those skilled in the art will also realize that such equivalent constructions do not depart from the spirit and scope of the present disclosure, and that they may make various changes, substitutions, and alterations herein without departing from the spirit and scope of the subjoined claims.

What is claimed is:

1. An image sensor, comprising:
   a substrate;
   an interconnect structure comprising an interlayer dielectric and a metal line disposed on the substrate;
   a semiconductor layer, disposed on the interconnect structure, comprising grooves with semi-oval shaped profiles on a first side surface of the semiconductor layer;
   photodiodes disposed directly on the interlayer dielectric and in the semiconductor layer, wherein the grooves are disposed on the photodiodes;
   an isolation structure disposed on the semiconductor layer, wherein the isolation structure comprises:
      a first portion having a depth substantially equal to a thickness of the semiconductor layer and disposed between a pair of the photodiodes; and
      a second portion disposed on the first portion and on the grooves; and
      a dielectric material disposed in the first and second portions, wherein the dielectric material is disposed in the grooves and extends on horizontal surfaces of the semiconductor layer between pairs of the grooves; and
   a grid structure disposed on and aligned with the first portion of the isolation structures wherein the grid structure comprises a tapered cross-sectional profile.

2. The image sensor of claim 1, wherein the dielectric material extends along vertical surfaces of the semiconductor layer between one of the pairs of the grooves.

3. The image sensor of claim 1, wherein the first portion extends below bottom surfaces of the grooves.

4. The image sensor of claim 1, wherein the grid structure comprises aluminum.

5. The image sensor of claim 1, further comprising a buffer layer disposed between the grid structure and the isolation structure.

6. The image sensor of claim 1, further comprising a second dielectric material disposed in the first and second portions of the isolation structure.

7. The image sensor of claim 1, further comprising a second dielectric material disposed along sidewalls of the grooves, wherein the second dielectric material has a higher dielectric constant than the dielectric material.

8. The image sensor of claim 1, further comprising a dielectric layer disposed between the semiconductor layer and the isolation structure.

9. The image sensor of claim 1, wherein each of the grooves comprises a width and a depth of about 20 nm to about 500 nm.

10. The image sensor of claim 1, further comprising a buffer layer disposed between the substrate and the interconnect structure, wherein the metal line of the interconnect structure is disposed directly on the buffer layer.

11. An image sensor, comprising:
    a substrate;
    an interconnect structure comprising an interlayer dielectric and a metal line disposed on the substrate;
    an array of photodiodes disposed directly on the interlayer dielectric;
    a semiconductor layer disposed on the array of photodiodes, comprising:
       an array of grooves with semi-oval shaped profiles aligned with the array of photodiodes, and
       a trench comprising:
          a rectangular-shaped profile and extending below bottom surfaces of the array of grooves, and
          a depth substantially equal to a thickness of the semiconductor layer;
    a dielectric layer disposed in the trench and the array of grooves, wherein a portion of the dielectric layer extends on horizontal surfaces of the semiconductor layer between the trench and the array of grooves; and
    a grid structure disposed on the dielectric layer and aligned with the trench, wherein the grid structure and the array of grooves are non-overlapping with each other along a direction perpendicular to a top surface of the dielectric layer.

12. The image sensor of claim 11, wherein the grid structure comprises a stacked structure comprising:
    a metal grid structure; and
    a dielectric grid structure stacked on the metal grid structure.

13. The image sensor of claim 11, wherein the trench extends below top surfaces of the array of photodiodes.

14. The image sensor of claim 11, wherein the grid structure comprises aluminum.

15. The image sensor of claim 11, further comprising a second dielectric layer disposed between the semiconductor layer and the dielectric layer.

16. The image sensor of claim 11, wherein each groove in the array of grooves comprises a width and a depth of about 20 nm to about 500 nm.

17. An image sensor, comprising:
    a substrate;
    a buffer layer disposed on the substrate;
    an interconnect structure comprising an interlayer dielectric and a metal line disposed on the buffer layer;
    a semiconductor layer, disposed on the interconnect structure, comprising grooves with semi-oval shaped profiles on a first side surface of the semiconductor layer;
    first and second radiation-detection devices disposed directly on the interlayer dielectric and in the semiconductor layer;
    an isolation structure disposed on the semiconductor layer, wherein the isolation structure comprises:

a first dielectric portion disposed in the grooves; and
a second dielectric portion extending between the first and second radiation-detection devices; and
a tapered metal structure disposed on the isolation structure.

18. The image sensor of claim 17, wherein the second dielectric portion extends to a depth that is greater than a depth of the grooves.

19. The image sensor of claim 17, wherein the grooves extend to a depth that is smaller than half of a depth of the second dielectric portion.

20. The image sensor of claim 17, wherein the tapered metal structure is disposed on and aligned to the second dielectric portion.

* * * * *